United States Patent [19]

Malmberg et al.

[11] 4,053,833
[45] Oct. 11, 1977

[54] CONTACTLESS TEST METHOD FOR INTEGRATED CIRCUITS

[75] Inventors: Paul R. Malmberg, Pittsburgh, Pa.; Robert M. Handy, Phoenix, Ariz.; Donald F. Stoneburner, Monroeville, Pa.; David Green, Painted Post, N.Y.

[73] Assignee: Westinghouse Electric Corporation, Pittsburgh, Pa.

[21] Appl. No.: 553,780

[22] Filed: Feb. 27, 1975

Related U.S. Application Data

[63] Continuation-in-part of Ser. No. 441,924, Feb. 12, 1974, Pat. No. 3,956,698.

[51] Int. Cl.² .................. G01R 31/26; G01R 15/12
[52] U.S. Cl. ........................ 324/158 R; 324/73 R
[58] Field of Search .......... 324/158 R, 73 R, 158 D, 324/158 T; 29/574

[56] References Cited

U.S. PATENT DOCUMENTS

| 3,801,910 | 4/1974 | Quinn | 324/158 R |
| T930,006 | 1/1975 | Beaufrere et al. | 324/158 R |

OTHER PUBLICATIONS

Donath, W. E.; "Testing of Integrated Circuits"; IBM Tech. Disc. Bull., Jan. 1966; p. 1166.

Primary Examiner—Rudolph V. Rolinec
Assistant Examiner—Ernest F. Karlsen
Attorney, Agent, or Firm—C. L. Menzemer

[57] ABSTRACT

A method is provided for contactless testing of an integrated circuit by fabricating, integrally with the integrated circuit, at least one and preferably a plurality of conductive semiconductor elements that are electrically connected between power and/or signal sources and inputs to the integrated circuit, and that are adapted to electrically conduct when exposed to a radiation beam. The conductive elements are selectively exposed by at least one radiation beam, such as an electron or light beam, to cause the conductive elements to electrically conduct and supply desired electrical inputs at the connected inputs of the integrated circuits; and the electrical responses of at least a segment of the integrated circuit to said electrical input are measured to determine whether said circuit segment possesses specified electrical characteristics. The integrated circuit can thus be selectively and sequentially tested by segments and modules. After testing, the conductive semiconductor elements are preferably disconnected from the integrated circuit, and the integrated circuit selectively connected electrically while accommodating and passivating defective components and modules of the circuit.

6 Claims, 7 Drawing Figures

CONTACTLESS TEST METHOD FOR INTEGRATED CIRCUITS

GOVERNMENT CONTRACT

This invention was made in the course of or under U.S. Government Contract No. F 33615-C-1335.

RELATED APPLICATIONS

The present application is a continuation-in-part application of copending application Ser. No. 441,924, filed Feb. 12, 1974, now U.S. Pat. No. 3,956,698.

FIELD OF THE INVENTION

The present invention relates to the testing of integrated circuits and other micro-miniature electronic components without the use of mechanical test probes.

BACKGROUND OF THE INVENTION

Integrated circuit technology is producing circuits with increasing complexity and component density. Elements as small as 1 and 2 microns in size can be produced using an electron image projection system described in U.S. Pat. No. 3,679,497, granted July 25, 1972. As a result, memory cells as small as $1.2 \times 10^{-6}$ $cm^2$ and gate areas as small as $4 \times 10^{-6}$ $cm^2$ are achievable, which should permit fabrication of an entire 20,000 gate logic, 256,000 bit memory computer on a 1 $cm^2$ semiconductor wafer.

One of the severely limiting factors on such micro-miniaturization is the testing procedure necessary to the circuit fabrication. It is practically impossible to manufacture a defect-free complex integrated circuit. Thus, during and/or after fabrication, the individual segments and modules of the circuit must be separately tested to determine whether the electrical characteristics are in accord with the design values within allowable tolerances. At present, such testing is done with mechanical probes which physically contact the input and output electrodes of the individual segments and modules so that a test device can measure the input and/or output voltage and current.

The problem is that the smallest area of metal which can be satifactorily contacted mechanically with a fine wire probe system is about $75 \times 75$ microns — larger than the individual logic gates of a high density integrated circuit. The test points become too numerous and too closely spaced to be mechanically contacted when the circuit is micro-miniaturized. Testing by mechanical probe thus places a limit on the density of the circuit unrelated to fabrication capabilities and limitations.

Further, testing by mechanical probes can cause severe damage to the integrated device. Although fine wire test probes may seem very flexible to a human observer, they are very stiff and heavy relative to the fine structure of integrated circuits. Mechanical probes (i) can contaminate and abrade the device surfaces so that subsequent fabrication steps, e.g. final metalization, cannot be effectively accomplished, and (ii) can exert high localized forces and introduce localized stresses so that active regions of the device are dislocated and distorted. In addition, a mechanical probe can score electrodes and damage oxide layers. Quality control and quantitative yields can, therefore, be increased by eliminating mechanical probes.

A finely-focused electron beam in a vacuum chamber can in some instances be used as a contactless probe in the testing of planar electron devices, and particularly integrated circuits, in place of mechanical contact probes. Under control from a digital computer, the electron beam can be very accurately addressed to coordinate locations on an integrated circuit at high speed. However, the use of an electron beam for contactless testing of integrated circuits is very restricted in its applications.

The use of multiple electron beams in contactless testing is virtually impossible. The apparatus for such multiple beams is bulky and requires separate control of the beams. Further, tremendous difficulty is encountered in isolation of the beams and in accurately addressing the beams relative to each other. As a result, only a single small-dimensioned electron beam is practicable for contactless testing. However, a single electron beam cannot hold both an input signal at a desired level at one address and also go to other coordinate addresses to, for example, set other input conditions or test the electrical characteristics of the circuit. Moreover, testing circuits with an electron beam presents difficulties in deenergizing or isolating circuits not being tested while energizing the particular segment or module under test.

The present invention overcomes these difficulties and disadvantages. It permits one or more input conditions to be set by a radiation beam and held at a desired level, while other input conditions are set preferably by a radiation beam and the electrical characteristics are tested preferably by an electron beam. It permits contactless testing of a single circuit module while the other circuit modules on an integrated circuit chip are maintained in a deenergized condition.

SUMMARY OF THE INVENTION

A method is provided for contactless testing of integrated circuits and particularly selective and sequentially testing of segments and modules of a high density integrated circuit. Specifically, small circuit or component segments and preferably modules (nodes) of an integrated circuit are selectively energized, and preferably also deenergized, with at least one radiation beam so that a large number of circuit segments or modules and/or a large number of inputs and outputs of a particular circuit segment or module can be rapidly tested without mechanical damage to the circuit. Thereafter, the good circuit modules or segments are preferably selectively connected in large scale integrated circuits by computer-derived wiring techniques.

The integrated circuit to be tested, preferably in modules (nodes), has fabricated integrally therewith at least one conductive semiconductor element with an input adapted for electrical connection to an electrical power or signal source and an output electrically connected to at least one input of the integrated circuit. Preferably, where the circuit is fabricated in modules, at least one semiconductor conductive element is provided for each power and each signal input to each module.

Each conductive semiconductor element is normally electrically nonconductive but is adapted to be electrically conductive when exposed to a radiation beam, such as an electron or light beam, and supply at the connected input to said integrated circuit a desired electrical input from said electrical source. Said conductive semiconductor element may require continued exposure to the radiation beam to maintain electrical conductivity between an electrical source and the connected input of the integrated circuit. Preferably, however, said conductive semiconductor elements are adapted to switch from a blocking state to a conductive state and maintain in a conductive state on limited irradiation, so that only a short duration exposure to a radiation beam is needed to establish the test conditions.

Thereafter, the inputs of the conductive semiconductor elements are connected to power and signal electrical sources, respectively. The conductive elements are then selectively exposed by at least one radiation beam, preferably from a standard electron microscope or a conventional gas laser, to cause the exposed conductive elements to electrically conduct and selectively supply the desired electrical power and electrical signals at the connected inputs to the integrated circuit. Electrical responses of at least segments of the integrated circuit to said electrical inputs are then selectively measured to determine whether said segments possess specified electrical characteristics.

Preferably, a single electron beam is used to expose the conductive semiconductor elements to provide the electrical inputs to the connected inputs of the integrated circuit as well as to measure the electrical characteristics of the integrated circuit in response to the electrical inputs. Alternatively, the electrical characteristics of the circuit are preferably measured with an electron beam, while one or more light beams (which do not interfere with the precision addressing of the electron beam) are used to selectively adapt the conductive elements to electrically conduct.

Where the integrated circuit is fabricated in modules, the modules can be and are preferably selectively and sequentially supplied with electrical power and signal inputs by selective exposure of the conductive semiconductor elements. Accordingly, the electrical responses of the modules can be separately measured to determine whether each module possesses the specified electrical characteristics based on the inputs.

In certain embodiments, each conductive semiconductor element is preferably fabricated so that it comprises a radiation activated thyristor and radiation activated transistor in parallel. By this arrangement, the desired electrical inputs supplied to the integrated circuit can be rendered electrically nonconductive as well as conductive without continued exposure of the conductive element with a radiation beam, thereby providing for more rapid testing of the integrated circuit. Alternatively, multiple power and signal inputs can be simultaneously supplied to the integrated circuit by fabricating at least some of the conductive elements as radiation activated transistors in close proximity.

Where multiple signal or power levels are needed at one input to test a given segment or module, it is preferred that a plurality of conductive semiconductor elements, with different resistance values corresponding to the desired input levels, be fabricated along with the integrated circuit and electrically connected to one input of said integrated circuit. The segment or module can thus be tested at the desired input levels by sequential exposure of the conductive elements, or combinations thereof, while the measurement of electrical responses of said segment or module is continued to determine whether the segment or module possesses specific electrical characteristics based on the electrical inputs.

In any case, the conductive semiconductor elements are preferably disconnected from the integrated circuit after testing. Thereafter, the segments or modules which test good are selectively electrically connected, and/or the segments or modules which test defective are selectively electrically disconnected from the integrated circuit.

Other details, objects and advantages of the invention will become apparent as the following description of the presently preferred embodiments and presently preferred methods of performing the invention proceeds.

BRIEF DESCRIPTION OF THE DRAWINGS

Referring to the drawings, the present preferred embodiments of the invention and present methods of performing the invention are illustrated, in which.

DESCRIPTION OF THE PREFERRED EMBODIMENTS

Figure 1:
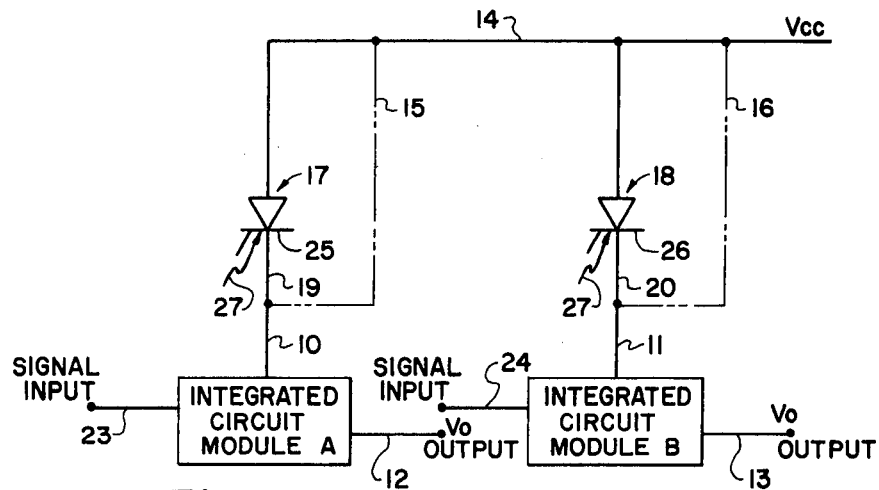
FIG. 1 is a circuit diagram showing means for performing the present invention.

Referring to FIG. 1, a circuit diagram is shown of an integrated circuit made utilizing the present invention. The integrated circuit preferably of high density is built, including integrated segments or modules A and B, preferably by use of the electron image projection system. Modules A and B are any integrated circuit modules requiring testing, e.g. transistor-transistor logic circuits and transistor-diode logic circuits. Segments or modules A and B are typically circuit segments, but in appropriate applications may be individual electrical components and devices. As part of the integrated circuit structure, modules A and B are provided with power input leads 10 and 11, respectively, signal input leads 23 and 24, respectively, and output leads 12 and 13, respectively. The modules are designed to be supplied with electrical power through leads 10 and 11 and leads 15 and 16 from common supply bus 14; but at the test stage as hereinafter described, leads 15 and 16 are not yet electrically connected to the circuit modules. The electrical signal input is typically supplied to the modules through leads 23 and 24 from external contact pads or other parts of the integrated circuit.

Also fabricated as part of the integrated circuit structure are conductive semiconductor elements 17 and 18 having output leads 19 and 20, respectively, electrically connected typically ohmically to power input leads 10 and 11 of circuit modules A and B, respectively. Conductive elements 17 and 18 have base regions 25 and 26, respectively, of configurations so that the conductive elements, which are normally electrically nonconductive and blocking, are adapted to be electrically conductive on selective exposure to radiation beam 27 typically of fine dimensions of any suitable radiation, such as electron or light radiation. Conductive elements 17 and 18 also have input leads 21 and 22 electrically connected to the common power supply bus 14.

Conductive semiconductor elements 17 and 18 are typically conventional electron or light radiation activated thyristors with a four-layer structure. The radiation exposure in turn changes the electrical mode of each device from a high impedance blocking state to a low impedance conducting state. The conductive element preferably remains in the low impedance state so long as the supply current is applied without continuing exposure by the radiation beam.

Alternatively, conductive semiconductor elements 17 and 18 are conventional electron or light radiation activated transistors with a three-layer structure and preferably a relatively long turn-off time. Such transistor continues in the conduction mode so long as radiation is continued, which can be done with one or more light beams without interfering with the testing of the integrated circuit with an electron beam. Preferably, however, such transistors are adapted to reach a saturation condition on exposure to an electron beam so that substantial stored charge remains in the base region at the end of the exposure and a long turn-off time results. The long turn-off time enables the transistor to remain in a conducting state long enough for an electron beam to be deflected elsewhere in the circuit to turn-on other inputs and measure the electrical characteristics of the circuit.

After fabrication of the integrated circuit, conductive semiconductor elements 17 and 18 are selectively exposed to radiation beam 27 to cause the elements to switch to a conducting state and selectively supply the desired electrical input signal to the circuit module A or B through input lead 10 or 11. Beam 27 is preferably a fine-dimensioned radiation beam projected by a standard scanning electron microscope so that the beam can be accurately addressed and deflected at high speed to various locations within a relatively large scan field. Alternatively, beam 27 is preferably one or more fine-dimensioned light beams preferably projected by commercially available collimated gas lasers so that the desired electrical input signals can be maintained without interfering with the electron beam that measures the electrical response of the integrated circuit to the electrical inputs. In this connection, it should be noted that the operation of each conductive element involves a multiplication by many times of the radiation energy. That is, the electron or light beam energy is many times less than the resulting electrical current from the conductive semiconductor element. This multiplication results from the fact that an electron or photon ($n$ 3.5 ev) bombarding conductive element produces a large number of electron-hole pairs and in turn a large number of carriers. Typical values for incident beam energy and resulting electrical current are $10^4$ volts and $10^{-8}$ amperes. While only a fraction of the carriers are conductive from the conductive element because of recombination (e.g. 5%), the gain factor is considerably higher than base-collector current gain of the conductive element, which also multiplies the current outputs.

Then, the circuit modules A and B may be selectively tested by measuring the current or voltage response in external output of input leads to the electrical supply at the electrical inputs, which typically includes in addition to the power input a signal input through lead 23. It should be emphasized that the electrical response of the module can be tested by measuring the total current supplied through bus 14 because the module being tested is substantially isolated from the remainder of the circuit, except for desired input signals through leads 23, and in turn leakage currents through other parts of the circuit cannot obscure the load current variations by the module being tested. Preferably, however, the electrical characteristics are measured by an electron beam utilizing known techniques, see e.g. U.S. Pat. No. 3,549,999.

After testing, the output leads 19 and 20 from the conductive semiconductor elements 17 and 18 to input leads 10 and 11 of the circuit modules are preferably disconnected; and preferably in immediate sequence, the leads 15 and 16 are formed to ohmically connect the inputs 10 and 11 to the supply bus 14 if desired. Preferably, these steps are accomplished by (i) selective metalization with standard vapor or sputter deposition techniques to deposit metal layers in the areas of the integrated circuit where leads 15 and 16S are to be formed, and (ii) photo- or electro-masking and selective etching of the newly formed metal layers and the leads 19 and 20. The conductive semiconductor elements used in testing are thereby disconnected and the input power supply leads concurrently connected.

Figure 2:
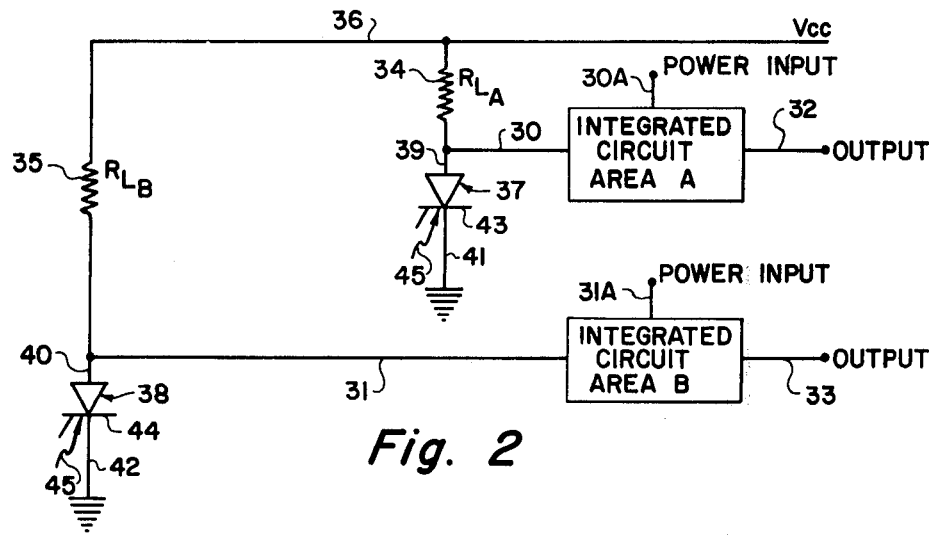
FIG. 2 is a circuit diagram showing alternative means for performing the present invention.

Referring to FIG. 2, an alternative or complimentary integrated circuit utilizing the present invention is shown where modules A and B have electrical signal inputs 30 and 31, electrical power inputs 30A and 31A, and electrical outputs 32 and 33, respectively. Inputs 30 and 31 are connected through load resistors 34 and 35 to supply bus 36. Electrical power is supplied to the modules through leads 30A and 31A and preferably through conductive semiconductor elements as shown in FIG. 1. Conductive semiconductor elements 37 and 38 are the same as conductive elements 17 and 18 described in connection with FIG. 1 except for differences in electrical characteristics because of the differences between power and signal inputs. Conductive elements 37 and 38 are connected to inputs 30 and 31, respectively, by input leads 39 and 40 and by output leads 41 and 42 connected to ground so that inputs of the conductive semiconductor elements are also connected indirectly through load resistors 34 and 35 to supply bus 36.

By this arrangement, the circuit modules A and B are selectively tested by selectively exposing base regions 43 and 44 of conductive elements 37 and 38 to radiation beam 45 which is preferably the same radiation beam 27 described above. That is, the conductive semiconductor elements connected to circuit modules or segments other than the module or modules to be tested are exposed to the radiation beam so the input load from the supply bus 36 is shunted to ground through the exposed conductive elements. This embodiment is particularly useful in testing logic circuits where the circuit modules must be tested in both "on" and "off" signal input conditions.

A difficulty with the use of the embodiments shown in FIGS. 1 and 2 is that usually the power to the entire circuit must be turned off at the supply bus between the test of each circuit module or segment. This turn-off permits the thyristor-conductive elements to return to the nonconductive state so that another circuit module can be isolated and selectively tested. This turn-off is not necessary where the conductive elements are transistors or other types of radiation conductive semiconductor elements that maintain electrical conductivity only while being irradiated (which provides an advantage with transistor conductive elements). However, as pointed out above, the testing time is limited with transistor conductive elements to the turn-off time of the transistor if single electron beam is utilized to set all input conditions as well as accomplish the measurement of the electrical characteristics of the circuit. Rather, in this embodiment, one or more light beams will usually be used to selectively maintain the conductivity of the conductive elements, while the electrical characteristics of the integrated circuit are measured preferably with an electron beam. Where thyristor conductive elements are used, the testing procedure is generally slowed by the need to turn-off the power supply between each test sequence, and discharge and recharge the relatively large capacitance of the power supply bus.

Figure 3:
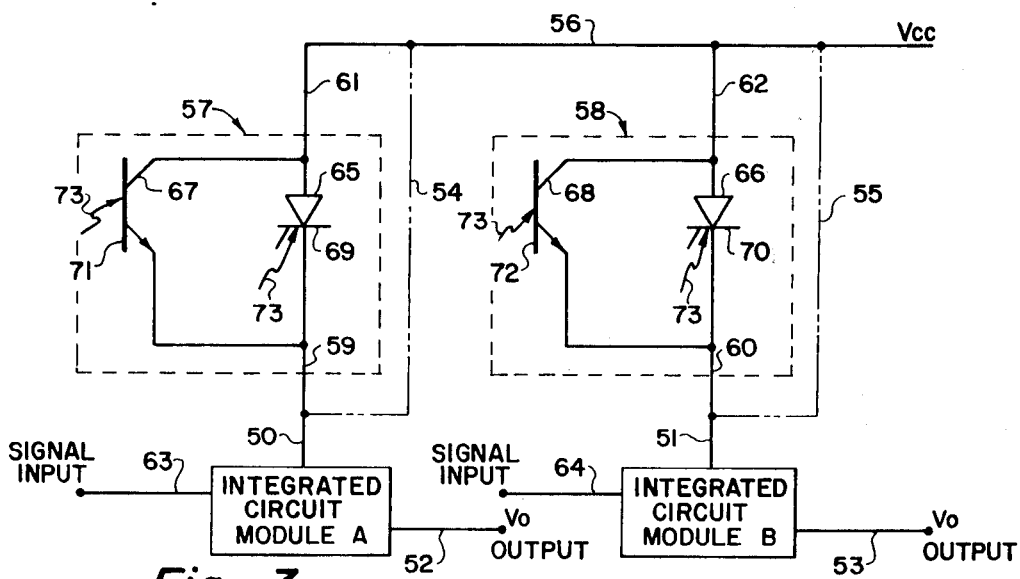
FIG. 3 is a circuit diagram showing second alternative means for performing the present invention.

Referring to FIG. 3, a second alternative integrated circuit utilizing the present invention is shown where the conductive element can be switched to and maintained in the conductive state with only a brief exposure to a radiation beam while the need to turn-off the external power supply between each test is avoided. Circuit modules A and B of the integrated circuit have electrical power inputs 50 and 51, electrical signal inputs 63 and 64, respectively, and electrical outputs 52 and 53, respectively. These circuit modules are designed to be supplied with electrical power through leads 54 and 55 from a common supply bus 56; but at the test stage as hereinafter described, leads 54 and 55 are not yet electrically connected to the circuit modules. An electrical signal input is also typically supplied to the modules through leads 63 and 64 from external contact pads or other parts of the integrated circuit.

Also fabricated as part of the integrated circuit structure are conductive semiconductor elements 57 and 58 having output leads 59 and 60, respectively, electrically connected to input leads 50 and 51 of circuit modules A and B, respectively. Conductive elements 57 and 58 are electrically connected by input leads 61 and 62 to common power supply bus 56.

Conductive semiconductor elements 57 and 58 in this embodiment comprise radiation activated thyristors 65 and 66 and radiation activated transistors 67 and 68. The thyristor and transistor of each conductive semiconductor element 57 and 58 are electrically connected in parallel between the input and output leads. The thyristors and transistors also have base regions 69, 70, 71 and 72, respectively, of configurations so that the transistors and thysistors are each capable of exposure by, for example, electron or light radiation beam 73 of typically fine dimensions.

In this embodiment, the electrical input power to each circuit module can be selectively turned-off as well as on by the radiation beam. For example, if circuit module A is to be tested, base region 69 of thyristor 65 would be selectively exposed to radiation beam 73 to cause the thyristor 65 and in turn conductive element 57 to change to the low impedance conductive state and supply the desired electrical input signal to the circuit module A at power input lead 50. The circuit module A is then selectively tested by measuring the current or voltage response in external leads 52 and 56 on supply of the desired electrical inputs to the module, which typically includes in addition to the power input, an electrical signal input through lead 63.

After completion of the test, radiation beam 73 is deflected to expose base region 71 of radiation activated transistor 67. The voltage drop through transistor 67 on exposure by the radiation beam is such that the current is caused to shunt through transistor 67 and cause the current flow through thyristor 65 to reduce below the holding current and cause the thyristor to resume a high impedance nonconductive mode. After the radtiation beam is removed from base region 71, transistor 67 also assumes a nonconductive state and module A is thus deenergized. Thereafter circuit module B can be electrically powered and tested by the same procedure without first turning off the electrical power supply in the external power bus 56. This embodiment, of course, provides a much more rapid off technique than deenergizing the entire integrated circuit because (i) the relatively large capacitance of the power supply bus does not have to be discharged and recharged for test of each circuit module and (ii) the radiation beam can be deflected at high speed to the transistor to turn-off the conductive element.

Figure 4:
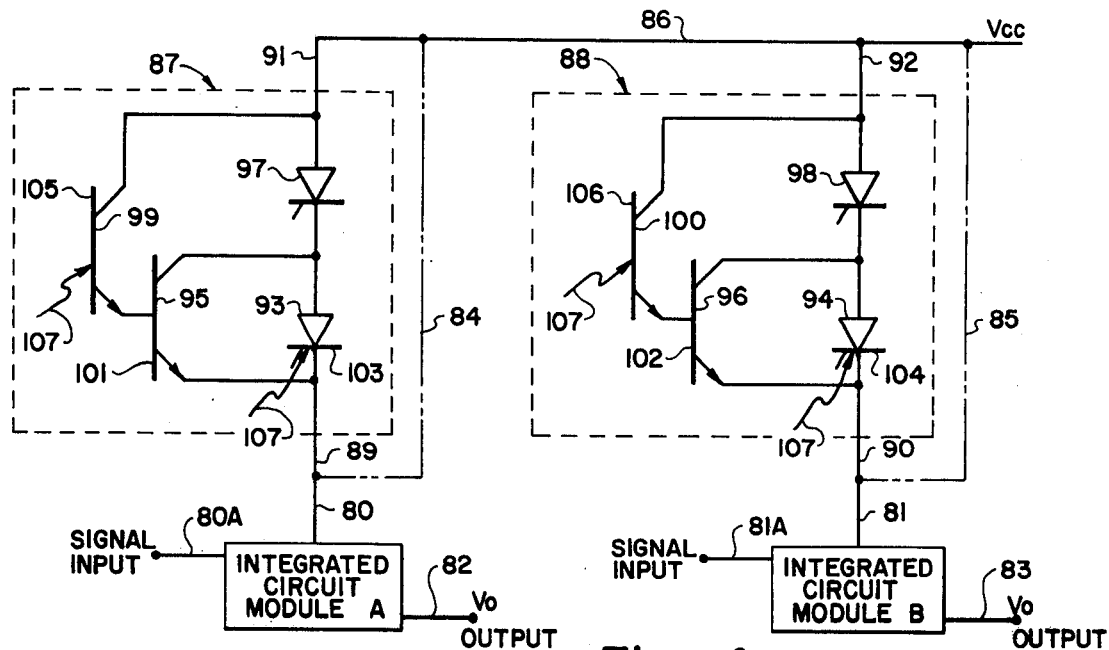
FIG. 4 is a circuit diagram showing third alternative means for performing the present invention.

Referring to FIG. 4, a third alternative integrated circuit utilizing the present invention is shown where the desired electrical power needed at the circuit modules is so large that it cannot be directly turned off by shunting with a radiation activated transistor. Specifically, modules A and B have electrical power inputs 80 and 81, electrical signal inputs 80A and 81A, and electrical outputs 82 and 83, respectively. Modules A and B are designed to be electrically connected to and supplied with electrical power through leads 84 and 85, respectively, from supply bus 86; but at the test stage as hereinafter described, leads 84 and 85 are not yet electrically connected to the circuit modules. Again, an electrical signal input is also typically supplied to the modules through leads 80A and 81A from an external source or other parts of the integrated circuit.

Fabricated as part of the integrated circuit structure are conductive semiconductor elements 87 and 88 having output leads 89 and 90, respectively, electrically connected to power input leads 80 and 81 of circuit modules A and B, respectively. Conductive semiconductor elements 87 and 88 are also electrically connected by input leads 91 and 92 to the common power supply bus 86.

Conductive semiconductor elements 87 and 88 comprise radiation activated thyristors 93 and 94, respectively, and electrical gated transistors 95 and 96 electrically connected in parallel with thyristors 93 and 94, respectively. Conductive elements 87 and 88 also have diodes 97 and 98, respectively, in series with thyristor 93 and transistor 95 and with thyristor 94 and transistor 96, respectively, and radiation-activated transistors 99 and 100, respectively, in parallel, respectively with diodes 97 and 98 and in series with collector-base portions of transistors 95 and 96, respectively. Thyristors 93 and 94 and transistors 99 and 100 have base regions 103, 104, 105 and 106, respectively, of configurations so that the devices which are normally electrically nonconductive are adapted to conduct when exposed by radiation beam 107, typically of light or electrons.

By this arrangement, the circuit modules A and B can be selectively supplied with the desired high level electrical input power and possibly other electrical input signals, tested, and thereafter electrically turned off so that another circuit module may be selectively tested. For example, circuit module A is selectively tested by first exposing the base region 103 of thyristor 93 to radiation beam 107 to cause the thyristor 93 to change from the nonconductive blocking mode to the conducting mode, and in turn supply the desired high level electrical input power to the circuit module A through input lead 80. The circuit module A is then selectively tested by measuring the current and/or voltage response in the external input or output leads 82 or 86 to the supply of the electrical inputs which again typically include in addition to the power input, an electrical signal input through lead 80A.

After testing, the electrical power input to the module A is switched off by exposing base region 105 of transistor 99 to radiation beam 107. Because of the blocking voltage provided by diode 97, the current is shunted through radiation activated transistor 99 so that transistor 95 is driven into saturation, thereby causing the high power electrical input to shunt through transistor 95 and drop the current flow through thyristor 93 below the holding current level. Thyristor 93 is thus caused to reassume its nonconductive blocking mode and, with removal of the radiation beam from transistor 99, turn off the electrical signal to input 80 of integrated circuit module A. This mode of turn-off of the thyristor is called a "cascade" turn-off.

The same procedure can thereafter be followed in selectively supplying electrical power to input 81 of circuit module B, testing circuit module B typically with additional electrical signal inputs, and thereafter turning off conductive element 88 by exposure of base region 106 of transistor 100 with radiation beam 107 and cascade shunting and turn-off of thyristor 94. Similarly, cascade shunting can also be used in turning "on" and "off" electrical input signals instead of input power.

Figure 5:
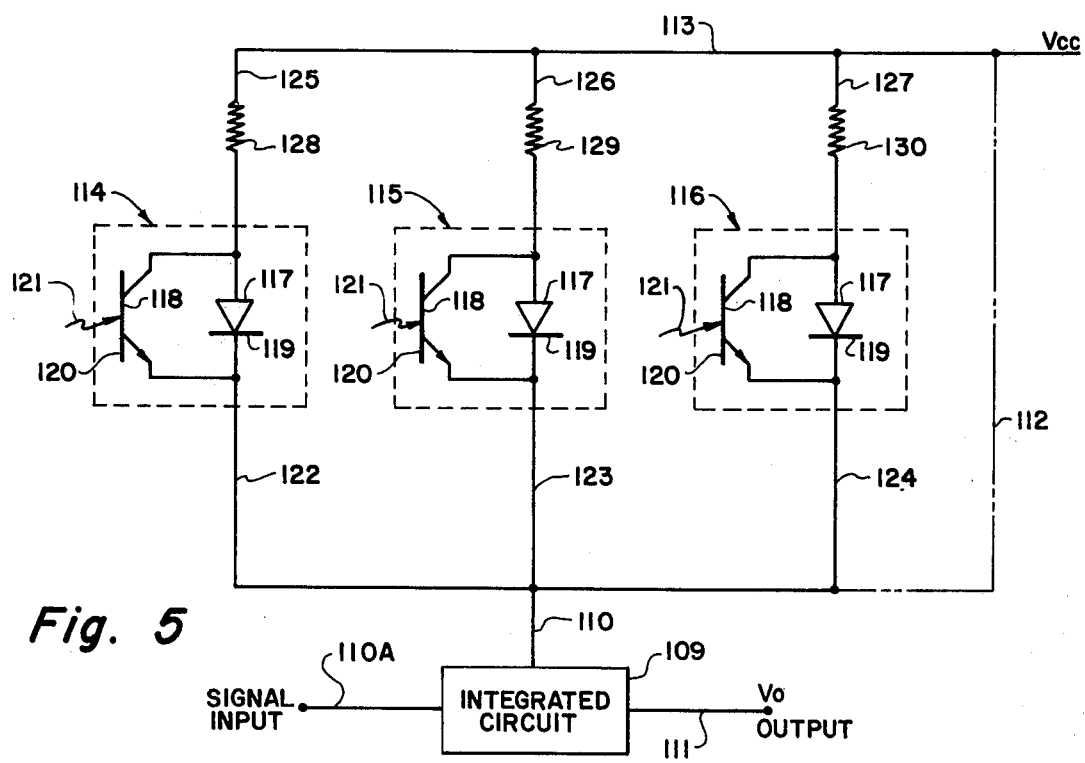
FIG. 5 is a circuit diagram showing fourth alternative means for performing the present invention.

Referring to FIG. 5, a fourth alternative integrated circuit is shown utilizing the present invention in which a plurality of electrical power inputs at different levels are selectively supplied to one input of the integrated circuit 109. Integrated circuit 109 is again preferably of high density built by the electron image projection technique. The integrated circuit has electrical power input 110, electrical signal input 110A and electrical output 111. The integrated circuit is designed to be supplied with electrical power through lead 112 from power supply bus 113; but at the test stage as hereinafter described, lead 112 is not yet electrically connected to the integrated circuit. The circuit is also designed to be supplied with an electrical input signal from an external circuit or other part of the integrated circuit through lead 110A.

Also fabricated as part of the integrated circuit structure are conductive semiconductor elements 114, 115 and 116. Each conductive element is comprised of radiation activated thyristor 117, and radiation activated transistor 118 connected electrically in parallel with thyristor 117. Thyristor 117 and transistor 118 also each have base regions 119 and 120, respectively, of configurations so that the devices, which are normally nonconductive, are adapted to electrically conduct when exposed to radiation beam 121 typically of light or electrons. Beam 121 is preferably a fine-dimensioned beam projected by a scanning electron microscope or collimated gas laser, and is adapted to be accurately addressed and deflected at high speed to various locations within a relatively large scan field.

Conductive semiconductor elements 114, 115 and 116 also are comprised of output leads 122, 123 and 124, respectively, electrically connected to power input lead 110 of the integrated circuit 109. Conductive semiconductor elements 14, 115 and 116 also are electrically connected by input leads 125, 126 and 127 through resistors 128, 129 and 130, respectively, to supply electrical power to the respective conductive elements from the common power supply bus 113.

By this arrangement, the electrical signal inputted to the integrated circuit 109 can be selected by selectively irradiating one or more of the thyristors of conductive elements 114, 115 and 116 with radiation beam 121. The electrical power inputted to the integrated circuit at power lead 110 is dependent upon the value of resistors 128, 129 and 130.

Preferably, the electrical power supply is varied so that the voltage from supply bus 113 to power input lead 110 remains substantially constant. In this situation the resistors preferably have weighted values in the ratios of 1:2:4. That is, resistor 128 has a unit resistance of 1, resistor 129 has a unit resistance of 2, and resistor 130 has a unit resistance of 4. By this weighting of the resistors relative to each other, the current levels supplied to the integrated circuit 109 through lead 110 can range in discrete levels from 0 to 7 times the current level which can be supplied to input 110 through resistor 128 and conductive element 114. That is, by causing conductive elements 114, 115 and 116 to electrically conduct in various combinations, the electrical current level at input 110 can range from 0 to 7 in discrete levels of 0, 1, 2, 3, 4, 5, 6 and 7. The electrical current level at input 110 can also be changed downwardly simply by irradiating the appropriate transistor 120 of conductive semiconductor elements 114, 115 or 116 so that the thyristor thereof resumes the electrical blocking states as explained in connection with FIG. 3.

Figure 6:
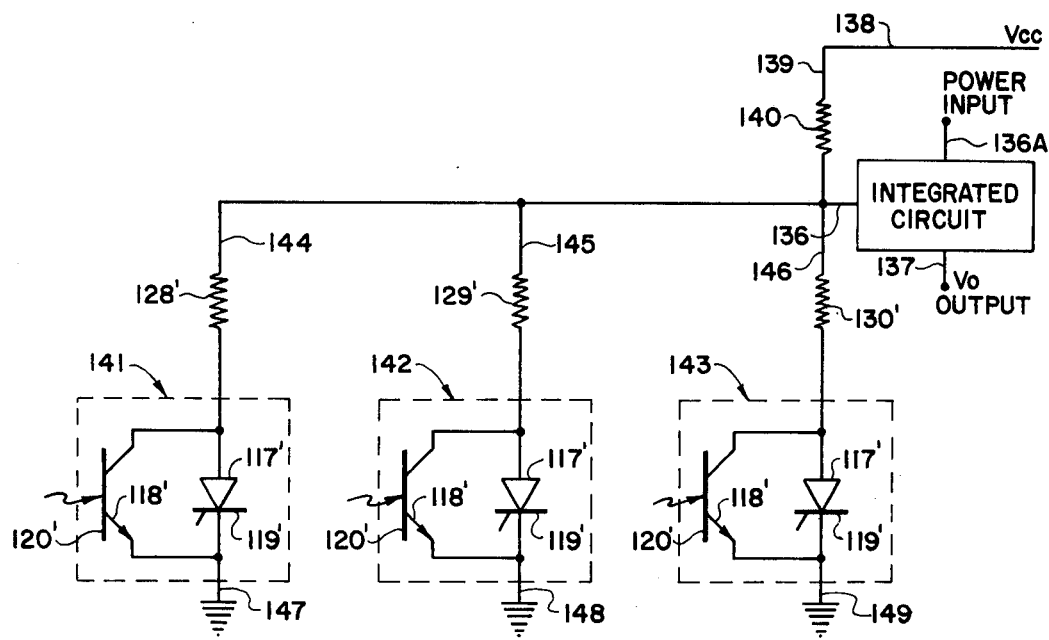
FIG. 6 is a circuit diagram showing fifth alternative means for performing the present invention.

Referring to FIG. 6, an alternative multi-level signal input arrangement of the present invention is shown. An integrated circuit 135 is shown having electrical signal input 136, electrical power input 136A, and electrical output 137. Signal input 136 is connected by lead 139 through load resistor 140 to power bus 138. Semiconductor conductive elements 141, 142 and 143, as described in connection with FIG. 5, are connected to input 136 by input leads 144, 145 and 146, respectively, and by output leads 147, 148 and 149 to ground so that the electrical inputs of the conductive semiconductor elements are also electrically connected indirectly to power supply bus 138. By this arrangement, the input signal to integrated circuit 135 through input 139 and load resistance 140 can be produced in discrete levels depending upon the values of resistors 128', 129' and 130'. Again, it may be preferred that the voltage be maintained substantially constant and the resistors have related ohmic values according to the ratios 1:2:4. In this way the multiple current level inputs to integrated circuit 135 relate to each other, and equally spaced discrete current levels can be supplied to the integrated circuit 135.

Figure 7:
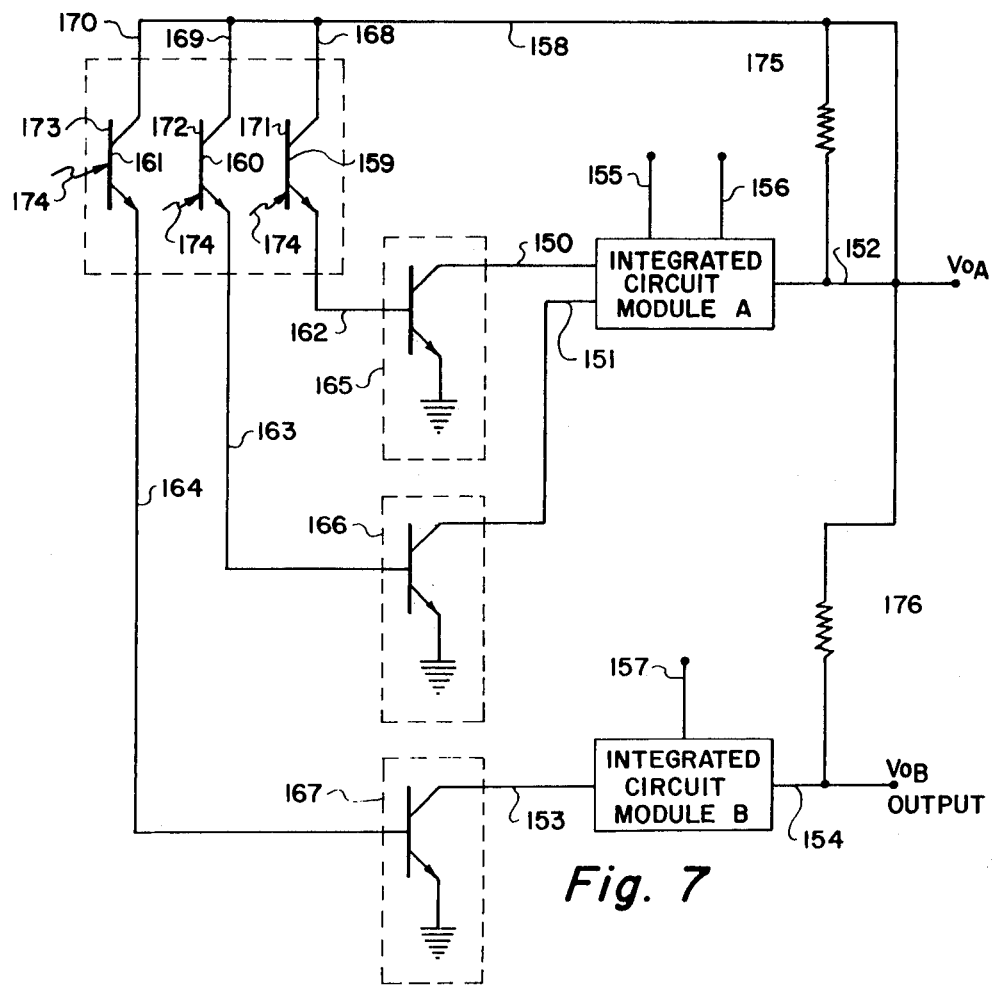
FIG. 7 is a circuit diagram showing sixth alternative means for performing the present invention.

Referring to FIG. 7, still another alternative embodiment of an integrated circuit made utilizing the present invention is shown. The integrated circuit, which includes integrated circuit modules A and B, preferably is again a high density circuit built by use of the electron image projection system. As part of the circuit structure, module A is provided with electrical input signal leads 150 and 151 and electrical output lead 152, and module B is provided with electrical input signal lead 153 and electrical output lead 154. The modules are designed to be connected by leads 155, 156 and 157; but at the test stage as hereinafter described, leads 155, 156 and 157 are not yet electrically connected to the circuit modules.

Also fabricated as part of the integrated circuit structure are conductive semiconductor elements 159, 160 and 161, each comprised of a radiation activated transistor and adapted to normally be nonconductive but capable of electrically conducting on exposure to a radiation beam. Conductive elements 159, 160 and 161 have output leads 162, 163 and 164, respectively, electrically connected through amplifier circuits 165, 166 and 167, respectively, to input leads 150, 151 and 152, respectively. Conductive elements 159, 160 and 161 also have input leads 168, 169 and 170 to supply electrical power to the respective conductive elements from the common power supply bus 158. Conductive elements 159, 160 and 161 also have base regions 171, 172 and 173, respectively, in close proximity and of configurations so that the conductive elements can be exposed to and simultaneously caused to assume an electrical conduction mode on exposure by a radiation beam 174.

Radiation beam 174 is again preferably a standard fine-dimensioned beam that is projected by a scanning electron microscope of collimated gas laser and the beam is preferably accurately addressed and deflected at high speed to various locations within a relatively large scan field. The close proximity of the base regions 171, 172 and 173 to each other permits an electron beam to be deflected from one base region to the other at a frequency sufficiently high to bridge the turn-off time of the transistors and thereby selectively maintain one or more or all of the transistors in the conducting mode during the testing of the circuit modules A and B, as desired without the use of a plurality of radiation beams to maintain all of the input conductions while the electrical characteristics of the circuit are tested.

For example, an electron beam may be deflected between base regions 171 and 172 of conductive semiconductor elements 159 and 160, respectively, to provide the desired electrical inputs at inputs 150 and 151 of circuit module A during testing of that module. Thereafter, the radiation beam can be deflected to base 173 of conductive element 161 to provide the input at 153 to the circuit module B for testing thereof.

Amplifier circuits 165, 166 and 167 are provided to boost the typically small current produced by the incidence of radiation beam 174 on the exposed conductive semiconductor element or elements. Further, the current gain of the amplifier circuits can be selected and controlled to provide the desired electrical inputs at inputs 150, 151 and 153.

As previously described, the circuit modules A and B may be tested by measuring the response or variation in electrical load level of the power supply 158 because the module being tested is isolated from the remainder of the circuit. FIG. 7 shows how the accuracy of this method can be enhanced by use of special low-value load resistors 175 and 176 of different values. Resistors 175 and 176 are connected between the outputs 152 and 154, respectively, of the circuit modules A and B and the power supply bus 158. Resistors 175 and 176 are generally 4 to 10 times lower in value than the load resistance within the respective integrated circuit modules. These resistors are formed as part of the integrated circuit and preferably are subsequently disconnected from the integrated circuit during processing steps subsequent to testing as herein otherwise described. The presence of resistors 175 and 176 permit differentiation in the various input and output conditions for checking desired (or specified) performance. This measurement is particularly useful in the testing of logic circuit modules with a relatively small number of gates.

As previously described in connection with FIG. 1, the conductive semiconductor elements are disconnected from the integrated circuit after testing. Also, leads and load resistors may be simultaneously formed to ohmically supply the desired electrical power supply and electrical signal inputs to and between the various segments and modules of the integrated circuit. This step is equally applicable in the processing, after testing, of the embodiments shown in FIGS. 2 through 7.

If a circuit is found on testing to be defective, it is preferably simply disconnected from the remainder of the integrated circuit during the subsequent disconnection step along with the conductive semiconductor elements. In this connection, it is preferred that the integrated circuit be fabricated with more modules than is necessary to accomplish the designed purpose of integrated circuit. In this way, the yield of the integrated circuit can be increased — in some cases, e.g. computer memories, to almost 100% — by accommodation and passivation of the defective circuit segments and modules within the finished integrated circuit. This is readily done, after testing of all of the circuit segments and modules, with a computer-derived photomask or electromask which will permit connection of the good modules and/or disconnection of the defective modules by known lithographic and etch techniques. It should also be noted in this connection that any defects in the conductive semiconductor elements are preferably treated as a defect in the integrated circuit segment or module under test to eliminate the need for testing the conductive elements before the testing of the integrated circuit; this preference is accomplished simply by inclusion of sufficient redundancy into the integrated circuit that the probable defects in the conductive semiconductor elements can be accommodated and passivated.

While the presently preferred embodiments have been shown and described with particularity, it is distinctly understood that the invention may be otherwise variously performed within the scope of the following claims.

What is claimed is:

1. A method of contactless testing an integrated circuit comprising:

A. fabricating integrally with an integral circuit to be tested a plurality of conductive semiconductor elements with different resistance values and having outputs electrically connected to at least one input to said integrated circuit, each conductive semiconductor element (i) having an input adapted for electrical connection to an electrical source and an output electrically connected to at least one input of said integrated circuit, and (ii) being adapted to electrically conduct when exposed to a radiation beam and supply at a connected input or inputs to said integrated circuit a desired electrical input;

B. connecting inputs of said conductive semiconductor elements to at least one electrical source;

C. selectively exposing at least one said conductive semiconductor element with a radiation beam to cause said conductive element to electrically conduct and supplying a plurality electrical inputs of different voltage levels at the connected inputs of said integrated circuit from the electrical source; and D. measuring electrical responses of at least a segment of the integrated circuit to said electrical input to determine whether said circuit segment possesses specified electrical characteristics.

2. A method of contactless testing an integrated circuit comprising:

A. fabricating integrally with an integrated circuit to be tested at least one conductive semiconductor element (i) having an input adapted for electrical connection to at least one input of said integrated circuit, (ii) being adapted to electrically conduct when exposed to a radiation beam and supply at the connected input to said integrated circuit a desired electrical input, and (iii) forming one radiation activated thyristor and one radiated activated transistor electrically connected in parallel in at least one conductive semiconductor element;

B. connecting inputs of said conductive semiconductor elements to at least one electrical source;

C. selectively exposing at least one said conductive semiconductor element with a radiation beam to cause said conductive element to electrically conduct and supply a desired electrical input to the connected inputs of the integrated circuit from the electrical source; and D. measuring electrical responses of at least a segment of the integrated circuit to said electrical input to determine whether said circuit segment possesses specified electrical characteristics.

3. A method of contactless testing an integrated circuit comprising:

A. fabricating integrally with an integrated circuit to be tested at least one conductive semiconductor element (i) having an input adapted for electrically connected to at electrical source and an output electricaly connected to at least one input of said integrated circuit, (ii) being adapted to electrically conduct when exposed to a radiation beam and supply at the connected input to said integrated circuit a desired electrical input; and (iii) forming at least two transistors in close proximity in at least one conductive semiconductor element;

B. connecting inputs of said conductive semiconductor elements to at least one electrical source;

C. selectively exposing at least one said conductive semiconductor element with a radiation beam to cause said conductive element to electrically conduct and supply a desired electrical input to the connected inputs of the integrated circuit from the electrical source; and D. measuring electrical responses of at least a segment of the integrated circuit to said electrical input to determine whether said circuit segment possesses specified electrical characteristics.

4. A method of contactless testing an integrated circuit comprising:

A. fabricating integrally with each segment of an integrated circuit to be tested at least one conductive semiconductor element (i) having an input adapted for electrical connection to an electrical source and an output electrically connected to at least one input of said segment, (ii) being adapted to electrically conduct when exposed to a radiation beam and supply at the connected input to said segment a desired electrical input; (iii) forming a plurality of conduct semiconductor elements with different resistance values and having outputs electrically connected to at least one input to said integrated circuit;

B. connecting inputs of said conductive semiconductor elemnts at least one electrical source;

C. selectively exposing at least one conductive semiconductor to a radiation beam to cause said conductive element to a conductive element to electrically conduct and supplying a desired electrical signal to a plurality of electrical inputs of different voltage levels at a connected input or inputs of said integrated circuit;

D. measuring electrical responses of said segment of the integrated circuit to said electrical input to determine whether said segment possesses specified electrical characteristics; and E. repeating steps C and D separately with respect to at least one other said segment of the integrated circuit.

5. A method of contactless testing an integrated circuit comprising:

A. fabricating integrally with each segment of an integrated circuit to be tested at least one conductive semiconductor element (i) having an input adapted for electrical connection to an electrical source and an output electrically connected to at least one input of said segment (ii) being adapted to electrically conduct when exposed to a radiation beam and supply at the connected input to said segment a desired electrical input; and (iii) forming one radiation activated thyristor and one radiated activated transistor electrically connected in parallel in at least one conductive semiconductor;

B. connecting inputs of said conductive semiconductor elements at least one electrical source;

C. selectively exposing at least one conductive semiconductor to a radiation beam to cause said conductive element to electrically conduct and supply a desired electrical signal to the connected inputs of one said segment of the integrated circuit from the electrical source;

D. measuring electrical responses of said segment of the integrated circuit to said electrical input to determint whether said segment possesses specified electrical characteristics; and E. repeating steps C and D separately with respect to at least one other said segment of the integrated circuit.

6. A method of contactless testing an integrated circuit comprising:

A. fabricating integrally with each segment of an integrated circuit to be tested at least one conductive semiconductor element (i) having an input adapted for electrical connection to an electrical source and an output electrically connected to at least one input of said segment, (ii) being adapted to electrically conduct when exposed to a radiation beam and supply at the connected input to said segment a desired electrical input, and (iii) forming at least two transistors in close proximity in at least one conductive semiconductor element;

B. connecting inputs of said conductive semiconductor elements at least one electrical source;

C. selectively exposing at least one conductive semiconductor to a radiation beam to cause said conductive element to electrically conduct and supply a desired electrical signal to the connected inputs of one said segment of the integrated circuit from the electrical source;

D. measuring electrical responses of said segment of the integrated circuit to said electrical input to determine whether said segment possesses specified electrical characteristics; and E. repeating steps C and D separately with respect to at least one other said segment of the integrated circuit.

* * * * *